(12) United States Patent
Wang et al.

(10) Patent No.: US 11,670,106 B2
(45) Date of Patent: Jun. 6, 2023

(54) METHOD FOR PREPARING OPTICAL FINGERPRINT SENSOR, OPTICAL FINGERPRINT SENSOR AND DISPLAY SCREEN (71) Applicant: BOE Technology Group Co., Ltd., Beijing (CN)

(72) Inventors: Jing Wang, Beijing (CN); Ming Liu, Beijing (CN); Zheng Liu, Beijing (CN); Hongwei Tian, Beijing (CN); Yibing Fan, Beijing (CN); Jia Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/504,372

(22) Filed: Oct. 18, 2021

(65) Prior Publication Data
US 2022/0129659 A1 Apr. 28, 2022

(30) Foreign Application Priority Data

Oct. 23, 2020 (CN) .......................... 202011149913.1

(51) Int. Cl.
*G09G 3/3208* (2016.01)
*G06V 40/13* (2022.01)

(52) U.S. Cl.
CPC ....... *G06V 40/1318* (2022.01); *G09G 3/3208* (2013.01); *H10K 50/813* (2023.02); *H10K 50/822* (2023.02); *H10K 59/122* (2023.02); *H10K 59/40* (2023.02); *H10K 71/00* (2023.02)

(58) Field of Classification Search
CPC .............. G06V 40/1318; H01L 27/323; H01L 27/3246; H01L 51/5209; H01L 51/5225; H01L 51/56; G09G 3/3208
See application file for complete search history.

(56) References Cited

U.S. PATENT DOCUMENTS

2021/0042493 A1* 2/2021 Lius ..................... G09G 3/3208

* cited by examiner

*Primary Examiner* — Abdul-Samad A Adediran
(74) *Attorney, Agent, or Firm* — IPro, PLLC (57) ABSTRACT An optical fingerprint sensor is provided. The optical fingerprint sensor includes a backplate structure layer, a pixel defining layer, and an organic photoelectric sensing layer, wherein the pixel defining layer is disposed on a side of the backplate structure layer; and a non-pixel region of the pixel defining layer is provided with a first non-pixel hole, and the organic photoelectric sensing layer is disposed in the first non-pixel hole.

13 Claims, 5 Drawing Sheets

FIG. 10

METHOD FOR PREPARING OPTICAL FINGERPRINT SENSOR, OPTICAL FINGERPRINT SENSOR AND DISPLAY SCREEN

CROSS-REFERENCE TO RELATED APPLICATION

This application claims priority to Chinese Patent Application No. 202011149913.1, filed on Oct. 23, 2020 and entitled "METHOD FOR PREPARING OPTICAL FINGERPRINT SENSOR, OPTICAL FINGERPRINT SENSOR AND DISPLAY SCREEN", which is incorporated herein by reference in its entirety.

TECHNICAL FIELD

The present disclosure relates to the field of display screen preparation technologies, and particularly relates to a method for preparing an optical fingerprint sensor, an optical fingerprint sensor and a display screen.

BACKGROUND

Optical fingerprint sensors can effectively identify users' fingerprints, and thus are applied in more and more fields, especially in electronic devices, such as touch display screens of mobile phones and computers. In addition, users' requirements on fingerprint identification and display of display screens are becoming increasingly high.

SUMMARY

In a first aspect of the present disclosure, an optical fingerprint sensor is provided. The optical fingerprint sensor includes a backplate structure layer, a pixel defining layer, and an organic photoelectric sensing layer, wherein the pixel defining layer is disposed on a side of the backplate structure layer; and a non-pixel region of the pixel defining layer is provided with a first non-pixel hole, and the organic photoelectric sensing layer is disposed in the first non-pixel hole.

Optionally, the first non-pixel hole is disposed between adjacent pixel holes of the pixel defining layer.

Optionally, the first non-pixel hole is adjacent to four pixel holes.

Optionally, the optical fingerprint sensor further includes first cathode layer, wherein the first cathode layer is disposed on a side of the organic photoelectric sensing layer away from the backplate structure layer.

Optionally, an orthographic projection of the organic photoelectric sensing layer on the pixel defining layer is within an orthographic projection of the first cathode layer on the pixel defining layer.

Optionally, the optical fingerprint sensor further includes a first anode layer, wherein the first anode layer is disposed on a bottom of the first non-pixel hole, and the organic photoelectric sensing layer is disposed on a side of the first anode layer away from the backplate structure layer.

Optionally, the non-pixel region of the pixel defining layer is further provided with a second non-pixel hole, and the optical fingerprint sensor further includes an organic photovoltaic layer, the organic photovoltaic layer being disposed in the second non-pixel hole.

Optionally, the optical fingerprint sensor further includes a second anode layer, wherein the second anode layer is disposed on a bottom of the second non-pixel hole, and the organic photovoltaic layer is disposed on a side of the second anode layer away from the backplate structure layer.

Optionally, the optical fingerprint sensor further includes a pixel layer, wherein the pixel layer is at least disposed in the pixel holes of the pixel defining layer.

Optionally, the optical fingerprint sensor further includes a second cathode layer, wherein the second cathode layer is disposed on a side of the pixel layer away from the backplate structure layer.

In a second aspect of the present disclosure, a method for preparing an optical fingerprint sensor is provided. The method includes: preparing a pixel defining layer on a side of a backplate structure layer; forming a first non-pixel hole in a non-pixel region of the pixel defining layer; and forming an organic photoelectric sensing layer in the first non-pixel hole.

Optionally, forming the first non-pixel hole in the non-pixel region of the pixel defining layer includes: forming the first non-pixel hole between adjacent pixel holes of the pixel defining layer.

Optionally, the method further includes: forming a first cathode layer on a side of the organic photoelectric sensing layer away from the backplate structure layer.

Optionally, prior to forming the organic photoelectric sensing layer in the first non-pixel hole, the method further includes: forming a first anode layer in the first non-pixel hole.

Optionally, forming the organic photoelectric sensing layer in the first non-pixel hole includes: coating the first non-pixel hole with an organic photoelectric sensing material by a solution method in an environment with a preset oxygen content, to form the organic photoelectric sensing layer.

Optionally, prior to forming the organic photoelectric sensing layer in the first non-pixel hole, the method further includes: forming a second non-pixel hole in the non-pixel region of the pixel defining layer; and forming an organic photovoltaic layer in the second non-pixel hole.

Optionally, prior to forming the organic photovoltaic layer in the second non-pixel hole, the method further includes: forming a second anode layer in the second non-pixel hole.

Optionally, after forming the first cathode layer on the side of the organic photoelectric sensing layer away from the backplate structure layer, the method further includes: f forming a pixel layer at least in the pixel holes of the pixel defining layer.

Optionally, the method further includes: forming a second cathode layer on a side of the pixel layer away from the backplate structure layer.

In a third aspect of the present disclosure, a display screen is provided. The display screen includes an optical fingerprint sensor, and the optical fingerprint sensor includes a backplate structure layer, a pixel defining layer, and an organic photoelectric sensing layer, wherein the pixel defining layer is disposed on a side of the backplate structure layer; and a non-pixel region of the pixel defining layer is provided with a first non-pixel hole, and the organic photoelectric sensing layer is disposed in the first non-pixel hole.

DETAILED DESCRIPTION

In order to make the objectives, technical solutions and advantages of the present disclosure clearer, the technical solutions of the present disclosure are described clearly and completely below with reference to the accompanying drawings. Apparently, the described embodiments are merely some embodiments, rather than all embodiments, of the present disclosure. Based on the described embodiments of the present disclosure, all other embodiments derived by persons of ordinary skill in the art without creative efforts shall fall within the protection scope of the present disclosure.

The technical and scientific terms used in the present disclosure should have the meanings as commonly understood by persons of ordinary skill in the art of the present disclosure, unless otherwise defined. The words "first", "second" and similar terms used in the present disclosure do not denote any order, quantity, or importance, and are merely used to distinguish different components. The word "comprise", "include" or similar terms mean that elements or objects appearing before the term cover the listed elements or objects and its equivalents appearing after the term while other elements or objects are not excluded. The word "connected" or "coupled" and similar terms are not limited to physical or mechanical connections, and may include electrical connection and the connection may be direct or indirect. "Upper", "lower", "left", "right" and the like are only used to indicate the relative positional relationship, and when the absolute position of a described object changes, the relative positional relationship may also change accordingly.

In order to make the following descriptions of the present disclosure clear and concise, detailed descriptions of known functions and known components are omitted in the present disclosure.

In a first aspect of the present disclosure, a method for preparing an optical fingerprint sensor is provided. The method includes the following steps S101-S104 shown in FIG. 1.

Figure 1:
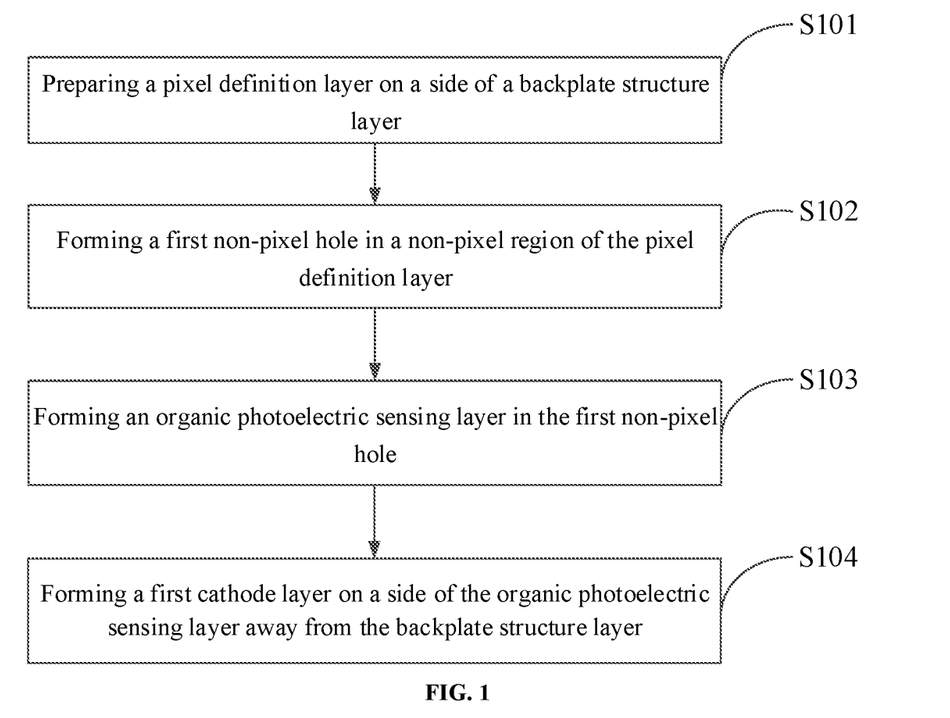
FIG. 1 is a flowchart of a method for preparing an optical fingerprint sensor according to an embodiment of the present disclosure.

In S101, a pixel defining layer is prepared on a side of a backplate structure layer.

Here, the backplate structure layer includes a substrate and other structure layers. The optical fingerprint sensor is prepared in a display screen. In the process of preparing the display screen, a support mask is adopted to determine the light-emitting position of the display screen. That is, the support mask is adopted to prepare the pixel defining layer. At least pixel holes are formed in the pixel defining layer. The support mask is provided with pixel preparation holes having a preset pattern, and the pixel preparation holes are configured to form pixel holes in the pixel defining layer by a patterning process.

In an exemplary embodiment, the backplate structure layer is coated with an adhesive layer. The adhesive layer is exposed and developed by using the support mask, and portions, corresponding to the pixel preparation holes of the support mask, of the adhesive layer are removed, to obtain the pixel defining layer (PDL). That is, a pixel defining layer with pixel holes is obtained. Here, the position on the pixel defining layer from which the adhesive layer is removed is a pixel region. After the adhesive layer is removed, the pixel holes are formed and are filled with pixels, to form a display region of the display screen.

In S102, a first non-pixel hole is formed in a non-pixel region of the pixel defining layer.

In an exemplary embodiment, the first non-pixel hole is formed by using the support mask. The non-pixel region of the pixel defining layer is a region, other than the pixel holes, on the pixel defining layer.

In the embodiment of the present disclosure, not only the pixel holes are formed in the pixel region of the pixel defining layer, but also the first non-pixel holes are also formed in the non-pixel region of the pixel defining layer. For example, a certain number of pixel preparation holes and first preset holes are formed in the support mask in advance. The first preset holes in the support mask are used to form the first non-pixel holes in the non-pixel region of the pixel defining layer, while the pixel preparation holes in the support mask are used to form the pixel holes in the pixel region of the pixel defining layer.

Figure 2:
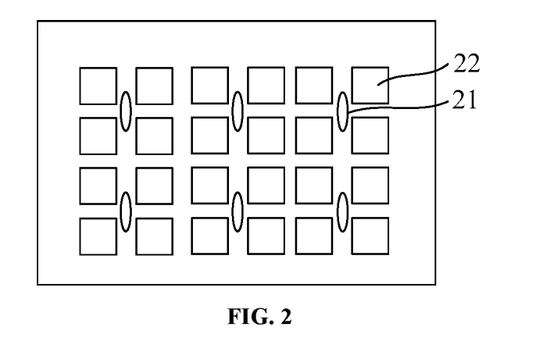
FIG. 2 is a schematic structural diagram of a support mask according to an embodiment of the present disclosure.

The first preset holes and the pixel preparation holes are respectively formed at different positions of the support mask. For example, referring to the structural schematic diagram of the support mask shown in FIG. 2, the ellipse represents the first preset hole 21, and the square represents the pixel preparation hole 22. The pixel preparation hole 22 is at a position, corresponding to the pixel region of the pixel defining layer, on the support mask. The first non-pixel hole is disposed between adjacent pixel holes of the pixel defining layer, and thus the first preset hole 21 is disposed between adjacent pixel preparation holes 22. The first preset hole 21 is at a position, corresponding to the non-pixel region of the pixel defining layer, on the support mask. FIG. 2 is illustrated by taking an example in which the first preset hole 21 is disposed in a region between every two adjacent pixel preparation holes 22.

FIG. 2 is only shows an implementation, and the shape and size of the pixel preparation hole 22, the shape and size of the first preset hole 21, and the relative position between the pixel preparation hole 22 and the first preset hole 21, etc., may also be set according to actual needs.

There is at least one first preset hole 21, that is, there is at least one first non-pixel hole. In an example, the number of the first preset holes 21 is the same as the number of the pixel preparation holes 22, and the positions of the first preset holes 21 are in one-to-one correspondence to the positions of the pixel preparation holes 22. For example, one first preset hole 21 is distributed on the same side of each of the pixel preparation holes 22, which can ensure the accuracy of fingerprint recognition. On the premise of ensuring fingerprint recognition, the difficulty of the preparation process can be reduced by providing fewer first preset holes 21. Therefore, the first preset holes 21 can be reduced to a certain number. For example, in FIG. 2, four pixel preparation holes 22 correspond to one first preset hole 21, and each first preset hole 21 is adjacent to four pixel preparation holes 22, such that each first non-pixel hole is adjacent to four pixel holes in the prepared optical fingerprint sensor.

In S103, an organic photoelectric sensing layer is formed in the first non-pixel hole.

For example, the organic photoelectric sensing layer is formed in the first non-pixel hole by coating the first non-pixel hole with an organic photoelectric sensing material.

After the first non-pixel hole is formed in the pixel defining layer, the first non-pixel hole is coated with the organic photoelectric sensing material, to form the organic photoelectric sensing layer. The organic photoelectric sensing material is sensitive to water and oxygen. Once external water and oxygen enter the optical fingerprint sensor to be in contact with the organic photoelectric sensing material, the organic photoelectric sensing material will be oxidized, which shortens the service life and degrades the performance of the optical fingerprint sensor. In the embodiments of the present disclosure, in an environment with a preset oxygen content, the organic photoelectric sensing material is coated by a solution method. The preset oxygen content is fewer than the oxygen content in the atmospheric environment, and the specific oxygen content is set according to production requirements such that the produced optical fingerprint sensor meets the requirements.

Photoresist used in photo pattern is adopted in the process of forming the organic photoelectric sensing layer, and the photoresist has no damage on the organic photoelectric sensing material. During the coating process, it is ensured that the organic photoelectric sensing material is the environment with the preset oxygen content, so as to avoid damage to the organic photoelectric sensing material.

In some exemplary embodiments, a first anode layer is formed in the first non-pixel hole before the organic photoelectric sensing layer is formed.

Generally, an anode layer is formed in the pixel holes and the anode layer is configured to light up pixels. When the organic photoelectric sensing layer is adopted to implement the function of fingerprint recognition, power supply is also needed. Therefore, the first anode layer is formed in the first non-pixel hole before the organic photoelectric sensing layer is formed. The first anode layer and the anode layer disposed in the pixel holes are the same layer. The first anode layer and the anode layer disposed in the pixel holes can be manufactured by using a support mask with pixel preparation holes and first preset holes, to manufacture first anode layer and a plurality of anode layers. In this way, the pixel layer and the organic photoelectric sensing layer share an anode. Therefore, the process is simplified, the preparation cost is saved and the thickness of the product is reduced.

In S104, a first cathode layer is formed on a side of the organic photoelectric sensing layer away from the backplate structure layer.

For example, the first cathode layer may be formed through evaporation.

In some exemplary embodiments, the organic photoelectric sensing layer is coated with the first cathode layer. That is, the orthographic projection of the organic photoelectric sensing layer on the pixel defining layer is within the orthographic projection of the first cathode layer on the pixel defining layer.

After the organic photoelectric sensing layer is formed, a pixel layer is prepared. The pixel layer usually includes a plurality of layers of different colors, such as a red layer, a green layer, and a blue layer. The organic photoelectric sensing layer is coated with the first cathode layer, such that the organic photoelectric sensing layer is separated from the pixel layer formed subsequently, which can prevent the pixel layer from affecting the organic photoelectric sensing layer, and also prevent the organic photoelectric sensing layer from being damaged during the process of preparing the pixel layer.

By forming the first cathode layer through evaporation on the side of the organic photoelectric sensing layer away from the backplate structure layer, the organic photoelectric sensing layer is coated with the first cathode layer. In some exemplary embodiments, the organic photoelectric sensing layer is only in contact with the first cathode layer, the pixel defining layer, and the first anode layer, but not in contact with other layers, such as the pixel layer, to avoid the organic photoelectric sensing layer from being damaged due to the direct contact between the pixel layer and the organic photoelectric sensing layer, and avoid the organic photoelectric sensing layer from being damaged in the process of preparing the pixel layer in the related art.

After the organic photoelectric sensing material is integrated in the display screen to form the organic photoelectric sensing layer, the function of fingerprint recognition can be realized. However, in some examples, the organic photoelectric sensing layer, the first cathode layer, the first anode layer, and the like form a fingerprint recognition circuit. The fingerprint recognition circuit has a dark current density of about $2 \times 10^{-7}$ mA/cm$^2$, and a reverse bias voltage of $-2$ V. Therefore, an initial voltage needs to be applied continuously and uninterruptedly to the fingerprint recognition circuit by using a circuit in the backplate structure layer, so as to supply power to the organic photoelectric sensing layer, which makes the cost higher.

Figure 3:
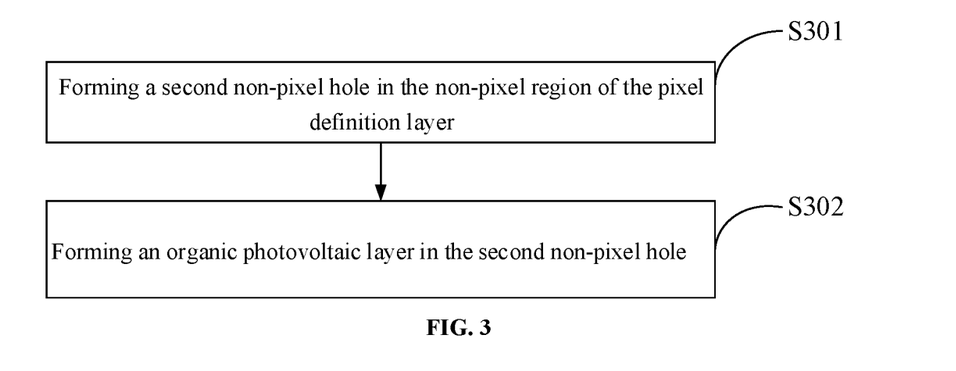
FIG. 3 is a flowchart of another method for preparing an optical fingerprint sensor according to an embodiment of the present disclosure.

In order to solve the above technical problems, in the preparation method provided by the embodiments of the present disclosure, the preparation process shown in FIG. 3 is performed before the organic photoelectric sensing layer is formed. The specific steps are as follows.

In S301, a second non-pixel hole is formed in the non-pixel region of the pixel defining layer.

For example, the second non-pixel hole is formed in the non-pixel region by using a support mask.

The support mask is provided with a second preset hole, which is formed at a position, corresponding to the non-pixel region of the pixel defining layer, on the support mask. The first preset hole and the second preset hole are spaced apart from each other.

By using the second preset hole of the support mask, the second non-pixel hole is formed in the non-pixel region of the pixel defining layer. There is at least one second preset hole, that is, there is at least one second non-pixel hole.

Figure 4:
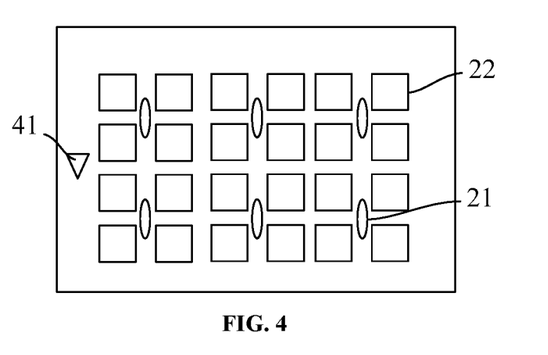
FIG. 4 is a schematic structural diagram of another support mask according to an embodiment of the present disclosure.

As an example, as shown in FIG. 4, one second preset hole 41 is formed in the support mask. In FIG. 4, the ellipse represents the first preset hole 21, the square represents the pixel preparation hole 22, and the triangle represents the second preset hole 41. The number of the second preset holes 41 is set based on the area of the display screen. More second preset holes 41 are generally provided in the display screen with a larger area. In addition, the size, shape, and position of the second preset hole in the support mask may also be adjusted according to actual needs, which is not specifically limited in the embodiments of the present disclosure.

In S302, an organic photovoltaic layer is formed in the second non-pixel hole.

For example, the organic photovoltaic layer is formed by coating t the second non-pixel hole with an organic photovoltaic material.

Figure 5:
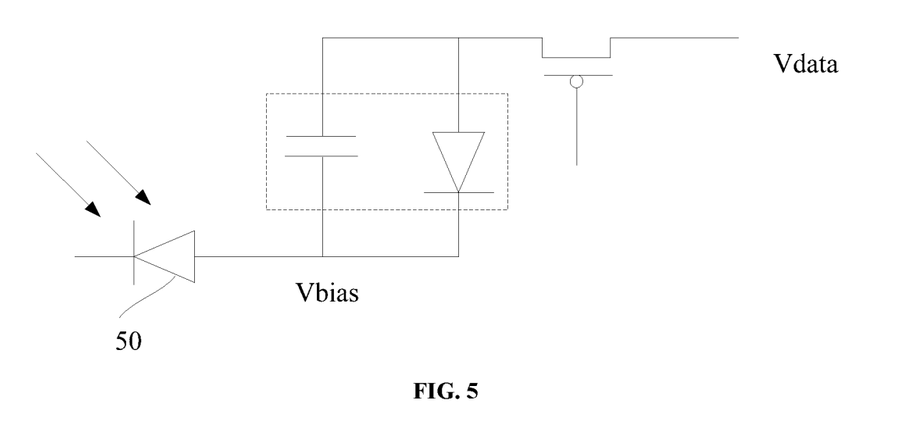
FIG. 5 is a circuit diagram showing supply of a voltage to a fingerprint recognition circuit by an organic photovoltaic layer according to an embodiment of the present disclosure.

After the second non-pixel hole is formed by using the second preset hole in the support mask, the second non-pixel hole is coated with the organic photovoltaic material, to form the organic photovoltaic layer. The organic photovoltaic layer can convert received light energy, such as solar energy, into electric energy, and supply the electric energy to the organic photoelectric sensing layer. Thus, there is no need to apply an initial voltage to the fingerprint recognition circuit by using the circuit in the backplate structure layer. FIG. 5 is a circuit diagram showing supply of a voltage to the fingerprint recognition circuit by an organic photovoltaic layer 50. The fingerprint recognition circuit is illustrated in the dashed box in FIG. 5.

Here, in addition to sunlight, the organic photovoltaic layer can also receive light emitted by the pixel layer to achieve photoelectric conversion. The second preset hole in the support mask is formed at a position closer to the pixel preparation hole, such that the organic photovoltaic layer can be disposed close to the pixel, and thus can better acquire light energy from the pixel layer.

In some examples, a second anode layer is also formed in the second non-pixel hole before the organic photovoltaic layer is formed. The preparation of the second anode layer is the same as the preparation of the first anode layer, which is not repeated herein.

Figure 6:
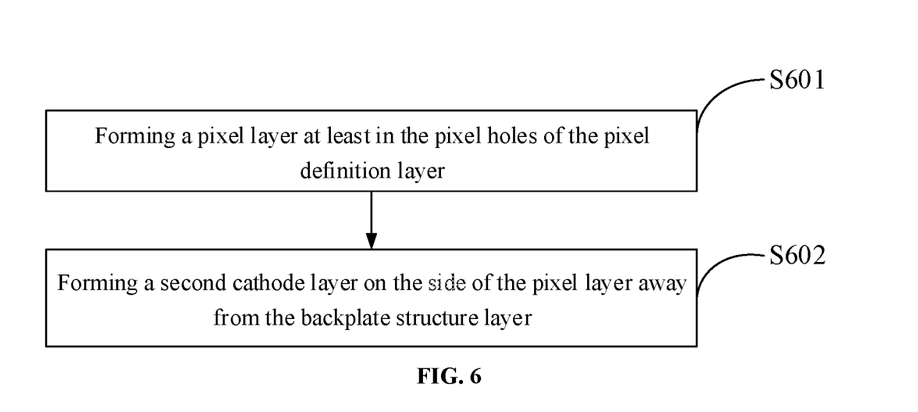
FIG. 6 is a flowchart of still another method for preparing an optical fingerprint sensor according to an embodiment of the present disclosure.

FIG. 6 shows a flowchart of another preparation method according to an embodiment of the present disclosure. After the first cathode layer is formed through evaporation on the side of the organic photoelectric sensing layer away from the backplate structure layer, the pixel layer and a cathode corresponding to the pixel layer are prepared according to the method flow shown in FIG. 6. The method specifically includes the following steps.

In S601, a pixel layer is formed at least in the pixel holes of the pixel defining layer.

For example, the side of the pixel defining layer away from the backplate structure layer and the side of the first cathode layer away from the backplate structure layer are coated with an optical organic material to form the pixel layer.

After the organic photoelectric sensing layer and the first cathode layer are prepared, the pixel layer is formed by using a fine mask through evaporation.

In S602, a second cathode layer is formed on the side of the pixel layer away from the backplate structure layer.

In an exemplary embodiment, the second cathode layer is formed through evaporation.

After the pixel layer is formed through evaporation, the second cathode layer is formed through evaporation on the side of the pixel layer away from the backplate structure layer to serve a cathode of a pixel. The second cathode layer and the first cathode layer are the same in material, preparation process and the like.

In the present disclosure, the organic photoelectric sensing layer is formed in the non-pixel region of the pixel defining layer by using the support mask, and the evaporation is performed without using a fine mask, such that the preparation cost is reduced, and the preparation efficiency is improved. The organic photoelectric sensing layer is prepared in the non-pixel region between the pixel holes, without occupying the space in the pixel holes, such that an aperture ratio of the pixel region in the display screen is not affected, thereby improving the screen brightness and the luminous efficiency and achieving a better display effect, compared with the display screen in the related art. The organic photovoltaic layer is used to perform photoelectric conversion to supply a bias voltage to the organic photoelectric sensing layer, and there is no need to separately supply an initial voltage to the organic photoelectric sensing layer, which simplifies the circuit structure, reduces the preparation cost, and improves the preparation efficiency.

Figure 7:
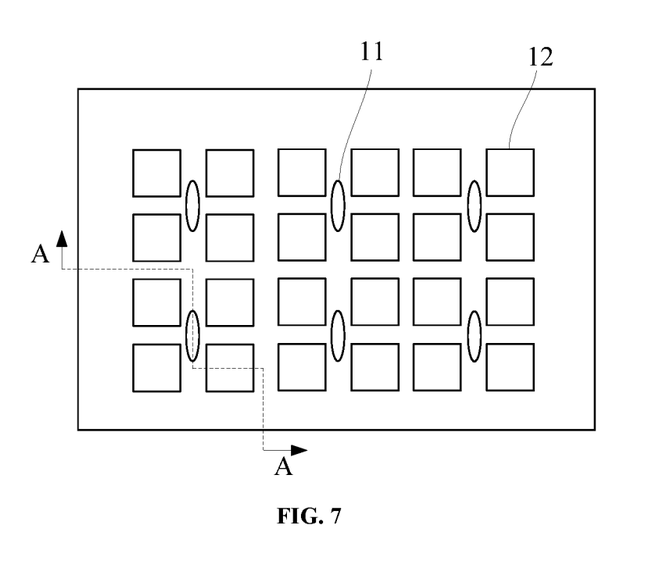
FIG. 7 is a top view of an optical fingerprint sensor according to an embodiment of the present disclosure.
Figure 8:
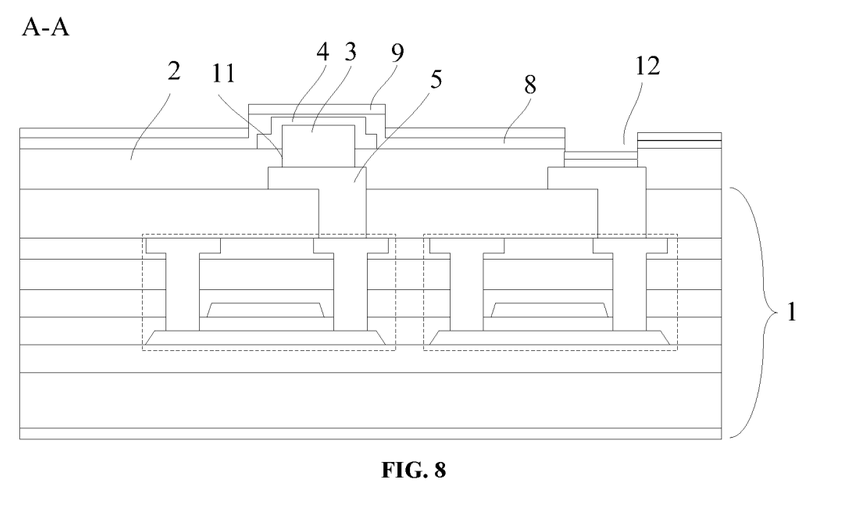
FIG. 8 is a sectional view along A-A in FIG. 7.

FIG. 7 is a top view of an optical fingerprint sensor according to an embodiment of the present disclosure. FIG. 8 is a sectional view along A-A in FIG. 7. As shown in FIG. 7 and FIG. 8, the optical fingerprint sensor includes a backplate structure layer 1, a pixel defining layer 2, and an organic photoelectric sensing layer 3. The pixel defining layer 2 is disposed on a side of the backplate structure layer 1. A non-pixel region of the pixel defining layer 2 is provided with a first non-pixel hole 11. The organic photoelectric sensing layer 3 is disposed in the first non-pixel hole 11.

In the embodiment of the present disclosure, the optical fingerprint sensor includes the backplate structure layer 1. The backplate structure layer 1 includes a substrate and other structures, which can play a supporting role, and the like.

In an exemplary embodiment, as shown in FIG. 8, the backplate structure layer 1 includes a base substrate, a plurality of film layers and a plurality of thin film transistors disposed on the base substrate. In FIG. 8, two thin film transistors are shown in dashed boxes. The plurality of film layers on the base substrate may include one or more of a buffer layer, a gate insulating layer, an interlayer dielectric layer, and a planarization layer, each of which may be one or more. Moreover, the structure shown in FIG. 8 is merely illustrative. In other examples, the backplate structure layer 1 may further include film layers other than the buffer layer, the gate insulating layer, the interlayer dielectric layer, and the planarization layer.

Furthermore, the optical fingerprint sensor further includes the pixel defining layer 2 attached to the backplate structure layer 1 and the organic photoelectric sensing layer 3 attached to the side of the pixel defining layer 2 away from the backplate structure layer 1. Similar to the pixel layer 8, a hole may be first formed in the pixel defining layer 2 by using a support mask, and then the organic photoelectric sensing layer 3 is formed in the hole. The organic photoelectric sensing layer 3 is disposed in a non-pixel region of the pixel defining layer 2. For example, the first non-pixel hole 11 is formed in the pixel defining layer 2 by using a support mask with a first preset hole, and the organic photoelectric sensing layer 3 is formed in the first non-pixel hole 11 in the pixel defining layer 2. Thus, the aperture ratio of the pixel region in the display screen is prevented from being reduced due to the arrangement of the organic photoelectric sensing layer 3 in the pixel hole 12, which is beneficial to improvement of the luminous efficiency of the display screen.

Optionally, the first non-pixel hole 11 is formed between adjacent pixel holes 12 of the pixel defining layer 2. The organic photoelectric sensing layer 3 is disposed in a region between the pixel holes 12, which not only saves the space, but also prevents the organic photoelectric sensing layer 3 from affecting the aperture ratio of the pixel region.

In an example, the number of the first non-pixel holes 11 is the same as the number of the pixel holes 12, and the positions of the first non-pixel holes 11 are in one-to-one correspondence to the positions of the pixel holes 12. For example, one first non-pixel hole 11 is distributed on the same side of each of the pixel holes 12, which can ensure the accuracy of fingerprint recognition. On the premise of ensuring the fingerprint recognition, the difficulty of the preparation process can be reduced by providing fewer first non-pixel holes 11. Therefore, the first non-pixel holes 21 can be reduced to a certain number. For example, as shown in FIG. 7, four pixel holes 12 correspond to one first non-pixel hole 11, and each first non-pixel hole 11 is adjacent to four pixel holes 22.

As shown in FIG. 8, the optical fingerprint sensor further includes a first cathode layer 4. The first cathode layer 4 is disposed on the side of the organic photoelectric sensing layer 3 away from the backplate structure layer 1. The first cathode layer 4 is attached to the side of the organic photoelectric sensing layer 3 away from the backplate structure layer 1.

In some examples, the organic photoelectric sensing layer 3 is coated with the first cathode layer 4. That is, the orthographic projection of the organic photoelectric sensing layer 3 on the pixel defining layer 2 is within the orthographic projection of the first cathode layer 4 on the pixel defining layer 2.

After the organic photoelectric sensing layer 3 is formed, a pixel layer 8 needs to be prepared. The pixel layer 8 generally includes a plurality of layers of different colors, such as a red layer, a green layer, and a blue layer. The organic photoelectric sensing layer 3 is coated with the first cathode layer 4, such that the organic photoelectric sensing layer 3 is separated from the pixel layer subsequently formed, which can prevent the pixel layer from affecting the organic photoelectric sensing layer 3, and also prevent the organic photoelectric sensing layer 3 from being damaged during the process of preparing the pixel layer 8.

As shown in FIG. 8, the optical fingerprint sensor further includes a first anode layer 5. The first anode layer 5 is disposed on the bottom of the first non-pixel hole 11. The organic photoelectric sensing layer 3 is disposed on the side of the first anode layer 5 away from the backplate structure layer 1.

The first anode layer 5 is disposed between the backplate structure layer 1 and the organic photoelectric sensing layer 3, and the first anode layer 5 forms a loop with the first cathode layer 4, such that the organic photoelectric sensing layer 3 can perform fingerprint recognition. The first anode layer 5 is connected to an anode layer of the pixel layer 8.

Figure 9:
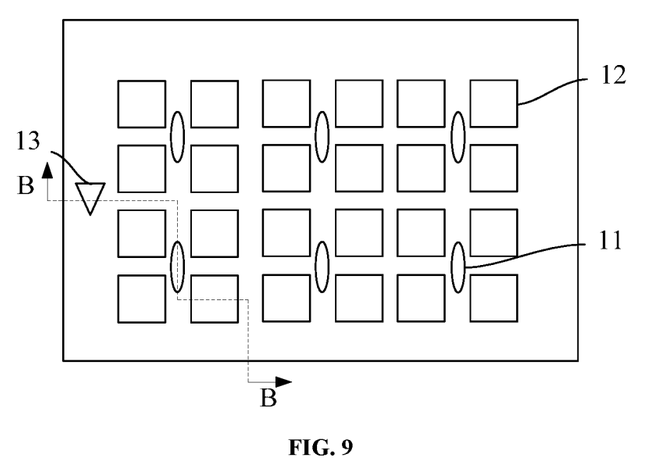
FIG. 9 is a top view of an optical fingerprint sensor according to an embodiment of the present disclosure.
Figure 10:
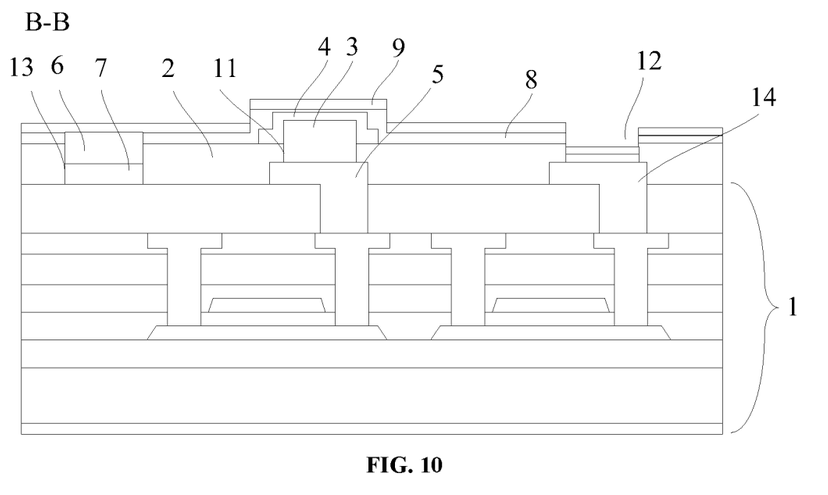
FIG. 10 is a sectional view along B-B in FIG. 9.

FIG. 9 is a top view of an optical fingerprint sensor according to an embodiment of the present disclosure. As shown in FIG. 9, the optical fingerprint sensor shown in FIG. 9 differs from the optical fingerprint sensor shown in FIG. 7 in that the non-pixel region of the pixel defining layer 2 is further provided with a second non-pixel hole 13. FIG. 10 is a sectional view along B-B in FIG. 9. As shown in FIG. 10, the optical fingerprint sensor further includes an organic photovoltaic layer 6 which is disposed in the second non-pixel hole 13. The organic photovoltaic layer 6 is attached to the side of the pixel defining layer 2 away from the backplate structure layer 1.

The optical fingerprint sensor further includes a second anode layer 7. The second anode layer 7 is disposed on the bottom of the second non-pixel hole 13, and the organic photovoltaic layer 6 is disposed on the side of the second anode layer 7 away from the backplate structure layer 1. The second anode layer 7 is disposed between the backplate structure layer 1 and the organic photovoltaic layer 6.

The organic photovoltaic layer 6 is disposed in the non-pixel region of the pixel defining layer 2, but does not overlap with the organic photoelectric sensing layer 3. The organic photovoltaic layer 6 can convert the acquired light energy into electric energy, and supply the electric energy to the organic photoelectric sensing layer 3. Therefore, the bias voltage can be supplied to the fingerprint recognition circuit, without supplying an initial voltage separately to the organic photoelectric sensing layer 3, thereby reducing the preparation cost. The light energy absorbed by the organic photovoltaic layer 6 may be ambient light, such as sunlight, or may be light from the display screen.

The optical fingerprint sensor further includes a pixel layer 8, which is at least disposed in the pixel hole 12 of the pixel defining layer 2. For example, as shown in FIG. 10, the pixel layer 8 is attached to the side of the pixel defining layer 2 and the side of the first cathode layer 4 away from the backplate structure layer 1. The pixel layer 8 can implement the display function of the display screen in which the optical fingerprint sensor is arranged and can also supply light energy to the organic photovoltaic layer 6.

The optical fingerprint sensor further includes a second cathode layer 9. The second cathode layer 9 is disposed on the side of the pixel layer 8 away from the backplate structure layer 1. The second cathode layer 9 is attached to the side of the pixel layer 8 away from the backplate structure layer 1, and the second cathode layer 9 forms a loop with the anode layer 14 corresponding to the pixel hole 12, such that the pixel layer 8 can implement the display function.

According to the present disclosure, the organic photoelectric sensing layer is formed in the non-pixel region of the pixel defining layer by using a support mask, and the evaporation is performed without using a fine mask, such that the preparation cost is reduced, and the preparation efficiency is improved. The organic photoelectric sensing layer is prepared in the non-pixel region between the pixel holes, without occupying the space in the pixel holes, such that an aperture ratio of the pixel region in the display screen is not affected, thereby improving the screen brightness and the luminous efficiency and achieving a better display effect, compared with the display screen in the related art. The organic photovoltaic layer is used to perform photoelectric conversion to supply a bias voltage to the organic photoelectric sensing layer, and there is no need to separately supply an initial voltage to the organic photoelectric sensing layer, which simplifies the circuit structure, reduces the preparation cost, and improves the preparation efficiency.

An embodiment of the present disclosure further provides a display screen, which at least includes the above-mentioned optical fingerprint sensor. The fingerprint recognition can be effectively implemented by using the above-mentioned optical fingerprint sensor, without affecting the luminous efficiency of the display screen.

The above descriptions are merely optional embodiments of the present disclosure and an explanation of the applied technical principles. Persons skilled in the art should understand that the scope of the present disclosure is not limited to the technical solutions formed by the specific combination of the above technical features, and should also cover other technical solutions formed by any combination of the above technical features or their equivalent features without departing from the concept of the present disclosure. For example, technical solutions formed by replacement of the above-mentioned features and the technical features having similar functions disclosed (but not limited to) in the present disclosure are also included in the scope of the present disclosure.

In addition, although various operations are described in a specific order, it should be understood that these operations are not limited to the shown specific order or sequential order. In certain circumstances, multitasking and parallel processing may be advantageous. Likewise, although several specific implementation details are included in the above discussion, the implementation details should not be construed as a limitation to the scope of the present disclosure. Certain features described in different embodiments may also be combined to be implemented in a single embodiment. Conversely, various features described a single embodiment may also be implemented in multiple embodiments individually or in any suitable sub-combination.

Although the subject matter has been described in language specific to structural features and/or logical actions of the method, it should be understood that the subject matter defined in the appended claims is not necessarily limited to the specific features or actions described above. On the contrary, the specific features and actions described above are merely examples of implementing the claims.

A plurality of embodiments of the present disclosure have been described in detail above, but the present disclosure is not limited to these specific embodiments. Persons skilled in the art can make a variety of variations and modifications to the embodiments based on the concept of the present disclosure. These variations and modifications should fall within the protection scope of the present disclosure.

What is claimed is:

1. An optical fingerprint sensor, comprising a backplate structure layer, a pixel defining layer, an organic photoelectric sensing layer, a first cathode layer, a first anode layer, and an organic photovoltaic layer, wherein
the pixel defining layer is disposed on a side of the backplate structure layer; and
a non-pixel region of the pixel defining layer is provided with a first non-pixel hole and a second non-pixel hole, wherein the organic photoelectric sensing layer is disposed in the first non-pixel hole, and the organic photovoltaic layer is disposed in the second non-pixel hole;
the first cathode layer is disposed on a side of the organic photoelectric sensing layer away from the backplate structure layer, and an orthographic projection of the organic photoelectric sensing layer on the pixel defining layer is within an orthographic projection of the first cathode layer on the pixel defining layer; and
the first anode layer is disposed on a bottom of the first non-pixel hole, and the organic photoelectric sensing layer is disposed on a side of the first anode layer away from the backplate structure layer.

2. The optical fingerprint sensor according to claim 1, wherein the first non-pixel hole is disposed between adjacent pixel holes of the pixel defining layer.

3. The optical fingerprint sensor according to claim 2, wherein the first non-pixel hole is adjacent to four pixel holes.

4. The optical fingerprint sensor according to claim 1, further comprising a second anode layer, wherein the second anode layer is disposed on a bottom of the second non-pixel hole, and the organic photovoltaic layer is disposed on a side of the second anode layer away from the backplate structure layer.

5. The optical fingerprint sensor according to claim 4, further comprising a pixel layer, wherein the pixel layer is at least disposed in the pixel holes of the pixel defining layer.

6. The optical fingerprint sensor according to claim 5, further comprising a second cathode layer, wherein the second cathode layer is disposed on a side of the pixel layer away from the backplate structure layer.

7. A method for preparing an optical fingerprint sensor, comprising:

preparing a pixel defining layer on a side of a backplate structure layer;
forming a first non-pixel hole in a non-pixel region of the pixel defining layer;
forming a first anode layer in the first non-pixel hole;
forming a second non-pixel hole in the non-pixel region of the pixel defining layer and an organic photovoltaic layer in the second non-pixel hole; then
forming an organic photoelectric sensing layer in the first non-pixel hole; and
forming a first cathode layer on a side of the organic photoelectric sensing layer away from the backplate structure layer.

8. The method according to claim 7, wherein forming the first non-pixel hole in the nonpixel region of the pixel defining layer comprises:
forming the first non-pixel hole between adjacent pixel holes of the pixel defining layer.

9. The method according to claim 7, wherein forming the organic photoelectric sensing layer in the first non-pixel hole comprises:
coating the first non-pixel hole with an organic photoelectric sensing material by a solution method in an environment with a preset oxygen content, to form the organic photoelectric sensing layer.

10. The method according to claim 7, wherein prior to forming the organic photovoltaic layer in the second non-pixel hole, the method further comprises:
forming a second anode layer in the second non-pixel hole.

11. The method according to claim 10, wherein after forming the first cathode layer on the side of the organic photoelectric sensing layer away from the backplate structure layer, the method further comprises:
forming a pixel layer at least in the pixel holes of the pixel defining layer.

12. The method according to claim 11, further comprising:
forming a second cathode layer on a side of the pixel layer away from the backplate structure layer.

13. A display screen, comprising an optical fingerprint sensor, the optical fingerprint sensor comprising a backplate structure layer, a pixel defining layer, an organic photoelectric sensing layer, a first cathode layer, a first anode layer, and an organic photovoltaic layer, wherein
the pixel defining layer is disposed on a side of the backplate structure layer; and
a non-pixel region of the pixel defining layer is provided with a first non-pixel hole, and a second non-pixel hole, wherein the organic photoelectric sensing layer is disposed in the first non-pixel hole, and the organic photovoltaic layer is disposed in the second non-pixel hole;
the first cathode layer is disposed on a side of the organic photoelectric sensing layer away from the backplate structure layer, and an orthographic projection of the organic photoelectric sensing layer on the pixel defining layer is within an orthographic projection of the first cathode layer on the pixel defining layer; and
the first anode layer is disposed on a bottom of the first non-pixel hole, and the organic photoelectric sensing layer is disposed on a side of the first anode layer away from the backplate structure layer.

* * * * *